United States Patent
Elmhurst et al.

(10) Patent No.: US 6,700,820 B2
(45) Date of Patent: Mar. 2, 2004

(54) PROGRAMMING NON-VOLATILE MEMORY DEVICES

(75) Inventors: Daniel R. Elmhurst, Cameron Park, CA (US); Kerry D. Tedrow, Folsom, CA (US); Paul D. Ruby, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 65 days.

(21) Appl. No.: 10/038,119

(22) Filed: Jan. 3, 2002

(65) Prior Publication Data
US 2003/0123295 A1 Jul. 3, 2003

(51) Int. Cl.[7] .............................. G11C 16/06
(52) U.S. Cl. ................ 365/185.22; 365/185.03; 365/185.19; 365/185.24; 365/230.08
(58) Field of Search ................. 365/185.22, 185.03, 365/185.19, 185.24, 230.08

(56) References Cited

U.S. PATENT DOCUMENTS

| | | | |
|---|---|---|---|
| 5,546,042 A | * | 8/1996 | Tedrow et al. ............. 327/538 |
| 5,677,869 A | | 10/1997 | Fazio et al. |
| 5,737,265 A | | 4/1998 | Atwood et al. |
| 5,943,260 A | * | 8/1999 | Hirakawa ............. 365/185.03 |
| 5,944,837 A | | 8/1999 | Talreja et al. |
| 6,091,631 A | | 7/2000 | Kucera et al. |
| 6,101,125 A | | 8/2000 | Gorman |
| 6,160,440 A | | 12/2000 | Javanifard et al. |
| 6,219,276 B1 | | 4/2001 | Parker |
| 6,233,178 B1 | | 5/2001 | Krishnamurthy et al. |
| 6,307,785 B1 | | 10/2001 | Takeuchi et al. |
| 2001/0019500 A1 | * | 9/2001 | Banks ................. 365/185.03 |

FOREIGN PATENT DOCUMENTS

EP   1 074 995 A1   2/2001

* cited by examiner

Primary Examiner—Van Thu Nguyen
Assistant Examiner—Toan Le
(74) Attorney, Agent, or Firm—Fish & Richardson P.C.

(57) ABSTRACT

Programming non-volatile memory devices includes identifying addresses in a data buffer for storing a particular one of a plurality of threshold voltage levels, then pulsing the array memory cells to program the array memory cells to the particular threshold voltage level. The identifying and pulsing is repeated for each of the threshold voltage levels.

26 Claims, 5 Drawing Sheets

PROGRAMMING NON-VOLATILE MEMORY DEVICES

BACKGROUND

The present invention relates to methods for programming non-volatile memory devices.

Non-volatile semiconductor memory is a fundamental building block for a typical computer system. One type of non-volatile semiconductor memory device is the multi-level electrically-erasable programmable read-only memory ("multi-level EEPROM").

Some memory cells store a signal representing one bit of information. Such memory cells may be placed in either of two states, each representing one of the binary elements "1" or "0."

In contrast, multi-level cells can store signals representing more than one bit and may be placed into any one of more than two states. Each state corresponds to a pattern of bits and the different states of the cell are distinguished by unique voltage threshold levels.

"Programming" means placing the multi-level memory cell into one of the multi-level memory cell's possible states. Programming may be accomplished by pulsing the multi-level memory cell with a pulse of predetermined voltage and duration. A device that supplies the pulsed power is called a "program pump," and the number of cells that can be a programmed at one time is referred to as "programming bandwidth."

DETAILED DESCRIPTION

Figure 1:
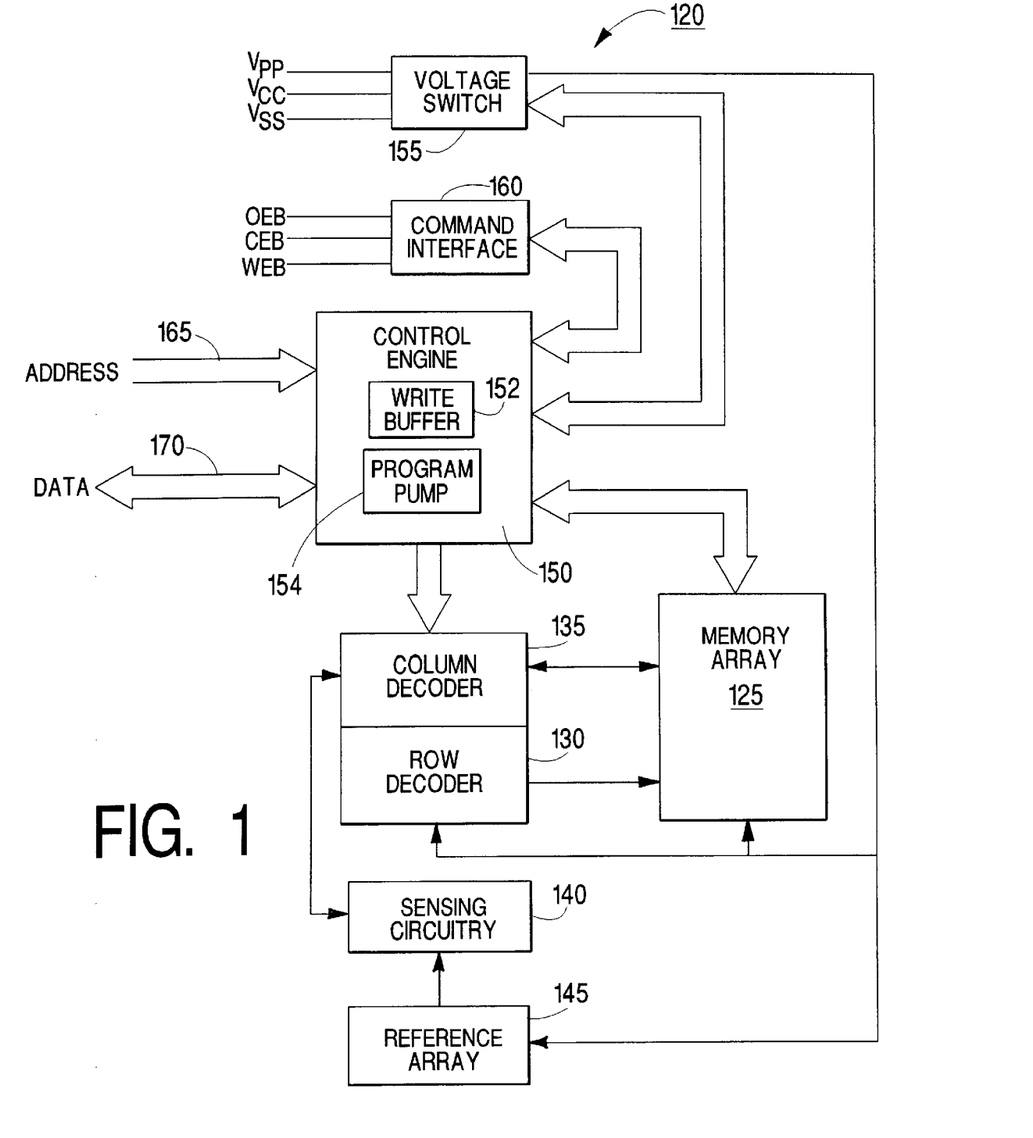
FIG. 1 illustrates a memory device.

As shown in FIG. 1 memory device 120 may be fabricated on a single semiconductor substrate and include a memory array 125, a row decoder 130, a column decoder 135, sensing circuitry 140, a reference array 145, a control engine 150, a voltage switch 155 and a command interface 160.

Memory device 120 receives address signals on address lines 165 and receives and sends data on bi-directional data lines 170. Data is stored using non-volatile memory cells within memory array 125. The memory array 125 may include any type of memory cell with programmable threshold voltages. Examples of such memory cells include cells with trapping dielectrics or floating gates. As an example, some memory cells may have a select gate, a floating gate, a source and a drain. Such memory cells may act as a field effect transistor having a threshold voltage that increases as charge is added to the floating gate. If the memory device 120 is non-volatile, control engine 150 may include a write buffer 152 including Static Random Access Memory (SRAM) for temporarily storing data with which to program memory array 125.

The maximum allowable power consumption of memory device 120 is a factor in determining the maximum number of memory cells that may be programmed at any one time. A program pump 154 supplies the current to program the memory cells. Therefore, the capability of program pump 154 to supply current is another factor affecting the maximum number of cells that may be programmed at any one time. Write buffer 152 should be selected to store at least enough data to program an optimum number of cells at a time.

To read data stored in memory array 125, the row decoder 130 and column decoder 135 select a number of memory cells of the memory array 125 in response to a user-provided address received on address lines 165. Row decoder 130 selects the appropriate row of memory array 125 and column decoder 135 selects the appropriate column (or columns) of memory array 125. Sensing circuitry 140 compares the states of the selected memory cells to the states of reference cells in reference array 145. Sensing circuitry 140 can include differential comparators that provide digital logic voltage levels in response to the comparisons between memory cells and reference cells. Other techniques for comparing voltages also can be used. Thus, the analog states of the memory cells can be expressed as digital data.

The number of bits stored by a multi-level memory cell depends on 1) the number of different analog states in which the cell may be placed by programming circuitry and 2) the number of different analog states that can be determined accurately by sensing circuitry. Because the operating voltage range of the memory array is limited, as the number of states increases, the states become closer together and must be placed more accurately to avoid confusion with other states.

Figure 2A:
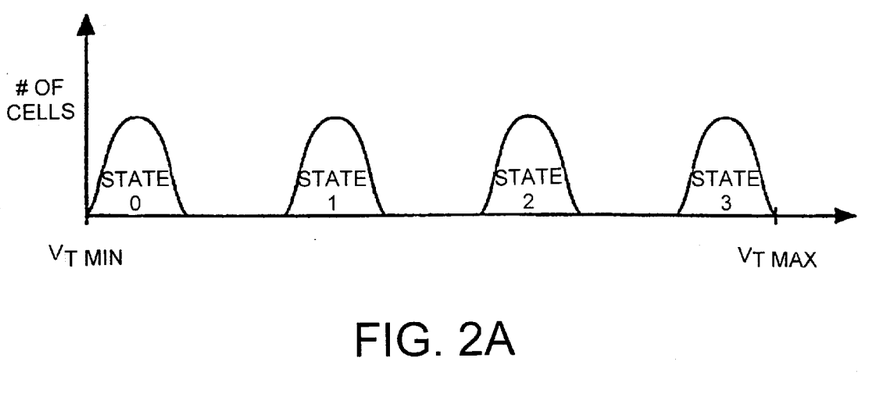
FIGS. 2A–2C illustrate alternative expressions for the states of a memory device.

FIG. 2A illustrates the programming distribution of the number of cells in a given state versus the threshold level voltage of that state. Four states, state 0, state 1, state 2 and state 3 are defined within the programming window.

Figure 2B:
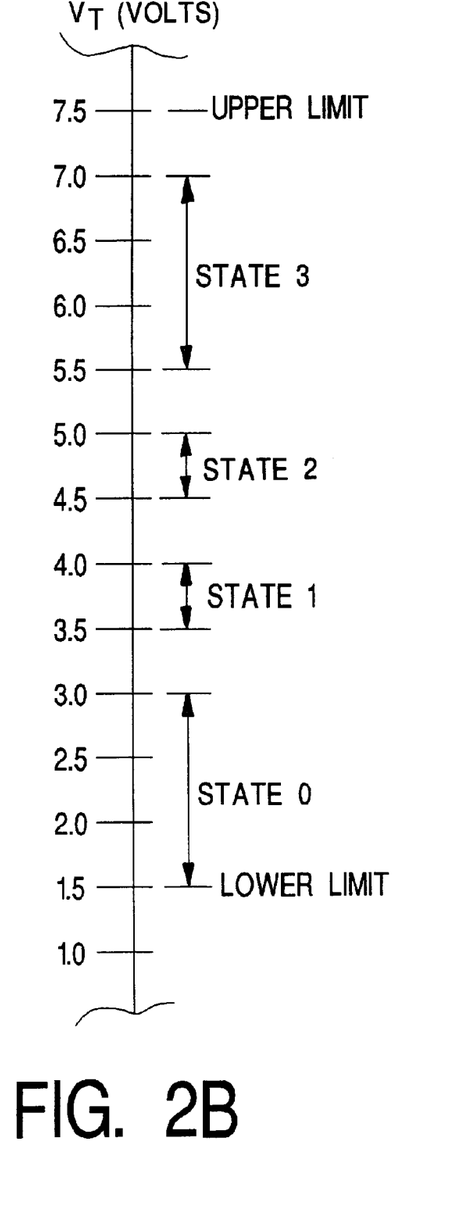
Figure 2C:
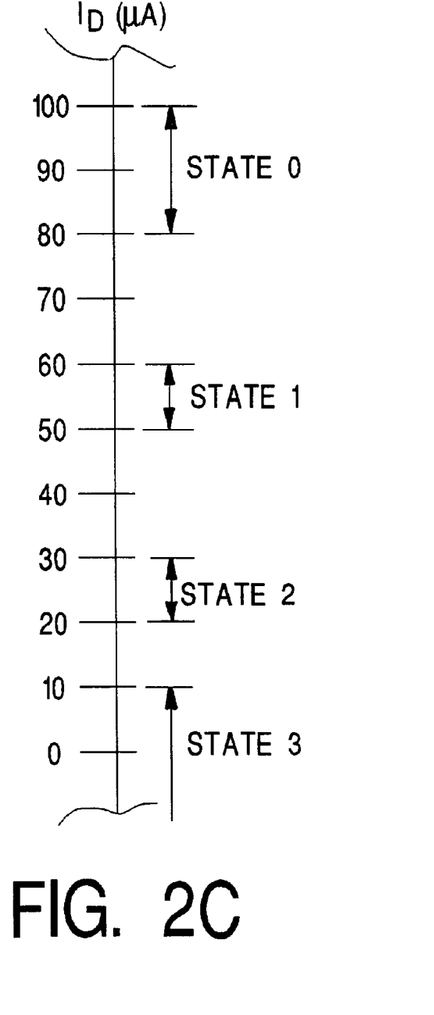

Although the state width and separation range width for FIG. 2A are shown as being equal, state width and separation range width may be defined somewhat more arbitrarily, and other considerations may limit the manner in which states may be defined. For example, for states closer to the edge of the programming window, it may be desirable to provide a larger state width. FIG. 2B shows state 0 and state 3 as occupying threshold voltage ranges of 1500 milli-volts (mv), as state 1 and state 2 each have a state width of only 500 mv. FIG. 2C shows the equivalent state distribution for FIG. 2B in terms of the cell current $I_d$.

After the cells are programmed, the cells are verified as being programmed to the correct voltage threshold level. Cells that fail to verify are re-pulsed. States having a large width, such as states on the ends of the programming band, can be programmed after fewer pulses than states in the middle of the band which are more narrowly bounded.

As illustrated in FIG. 1, control engine 150 controls the erasing and programming of cells in memory array 125. In one implementation, control engine 150 includes a processor that is controlled by microcode stored in on-chip memory. Alternatively, control engine 150 may be implemented as a state machine or by using combinational logic. Control engine 150 also may be implemented as a semiconductor device that externally controls the operation of memory device 120.

Control engine 150 manages memory array 125 by controlling row decoder 130, column decoder 135, sensing circuitry 140, reference cell array 145, program pump 154 and voltage switch 155. Voltage switch 155 controls the various voltage levels necessary to read, program and erase cells in memory array 125. User commands for reading, erasing and programming are communicated to control engine 150 through a command interface 160. The user issues commands on a data bus (not shown) to command interface 160. The commands are latched through use of the control pins write enable (WEB) and chip enable (CEB).

Non-volatile multi-level cells use one logical path for reading/verifying and another path for programming the multi-level cell. This allows the paths to be Read While Write (RWW) enabled and allows optimizations for programming. A separate write path may enable programming, for example, of 16, 32, 64 or more, cells in parallel. Such paths may be designated as ×16, ×32, ×64 and so on, respectively.

The maximum number of cells that can be programmed in parallel is limited by the program bandwidth. The more cells that are programmed in parallel speeds the programming process. However, the more cells that are programmed in parallel places greater power demands on the program pump. Consequently the speed advantage is counterbalanced and limited by the cost and die size associated with a larger program pump. Because the physical size of program pump 152 increases with its current supply capability, program bandwidth may be used as a proxy for the die size of program pump 152.

The number of cells that are accessed (queried) in parallel during a write (program) operation is called a "hunk." The hunk size limits the subset of data buffer addresses queried and determines how many accesses to the data buffer are required to identify all the cells requiring programming for a given level. For example, if a 512 bit write buffer is utilized with a ×64 hunk size, four accesses to the data buffer are needed to identify all the cells that require programming for a four-state multi-level memory array. In a four-state array, each array cell represents two bits. Therefore, 512 bits are equivalent to 256 cells. Because each access has a hunk size of ×64, 4 (=256/64) accesses are required.

With the assumption that the states (levels) are randomly distributed, the hunk size is important to maximizing usage of program pulsing at each level. Thus, as an initial calculation, the program pump should be sized to pulse at least 1/n cells of the hunk size, where n is the number of possible states for a cell. Using the example of a four-state memory array with a ×64 hunk size, the frequency distribution of an entire block filled with random data has an average 25% of the cells in each state. The states may be designated as L0, L1, L2 and L3 for level 0 through level 3, respectively. Therefore, in each hunk an average of sixteen cells will require programming to each level. The program pump should be capable of supplying sufficient current to program at least the expected 16 cells at once.

To optimize for typical program performance, the program pump should be increased in size to account for programming a few extra bits at levels L1 and/or L2. That is, for a ×64 hunk a typical distribution may be: 16 cells at L0, 14 cells at L1, 18 cells at L2 and 16 cells at L3. The program bandwidth would be ×18. L3 is of less concern because that level is more likely to verify quickly. The re-pulse, re-verify operations are time-consuming operations. Programming voltage at the highest level can be set further away from adjoining level voltages than can intermediate levels and, thus, is more likely to verify after fewer pulses. Intermediate level voltages, bounded as to over- and under-voltage, require more precise level setting to verify to the correct level and, therefore, may require more re-pulsing and re-verifying. In one implementation, level L3 data typically uses one pulse in contrast to the 10–14 pulses for levels L1 and L2. Increasing the hunk size results in diminishing returns based on program bandwidth as the size of the program pump begins to impact the die size.

Power loss recovery is a particular application that takes advantage of the fewer programming pulses required at the highest voltage level. In this application, a software program periodically causes a memory array cell to be programmed to level L3 as the program progresses. Hence, the location of the cell programmed to level L3 is a measure of which operations the software programmed has completed. Level L3 programming, as described above, often can be accomplished with one pulse. If a loss of power interrupts the software program, the software may take appropriate action after recovering power based upon the location of the level L3 data in the memory array.

Figure 3:
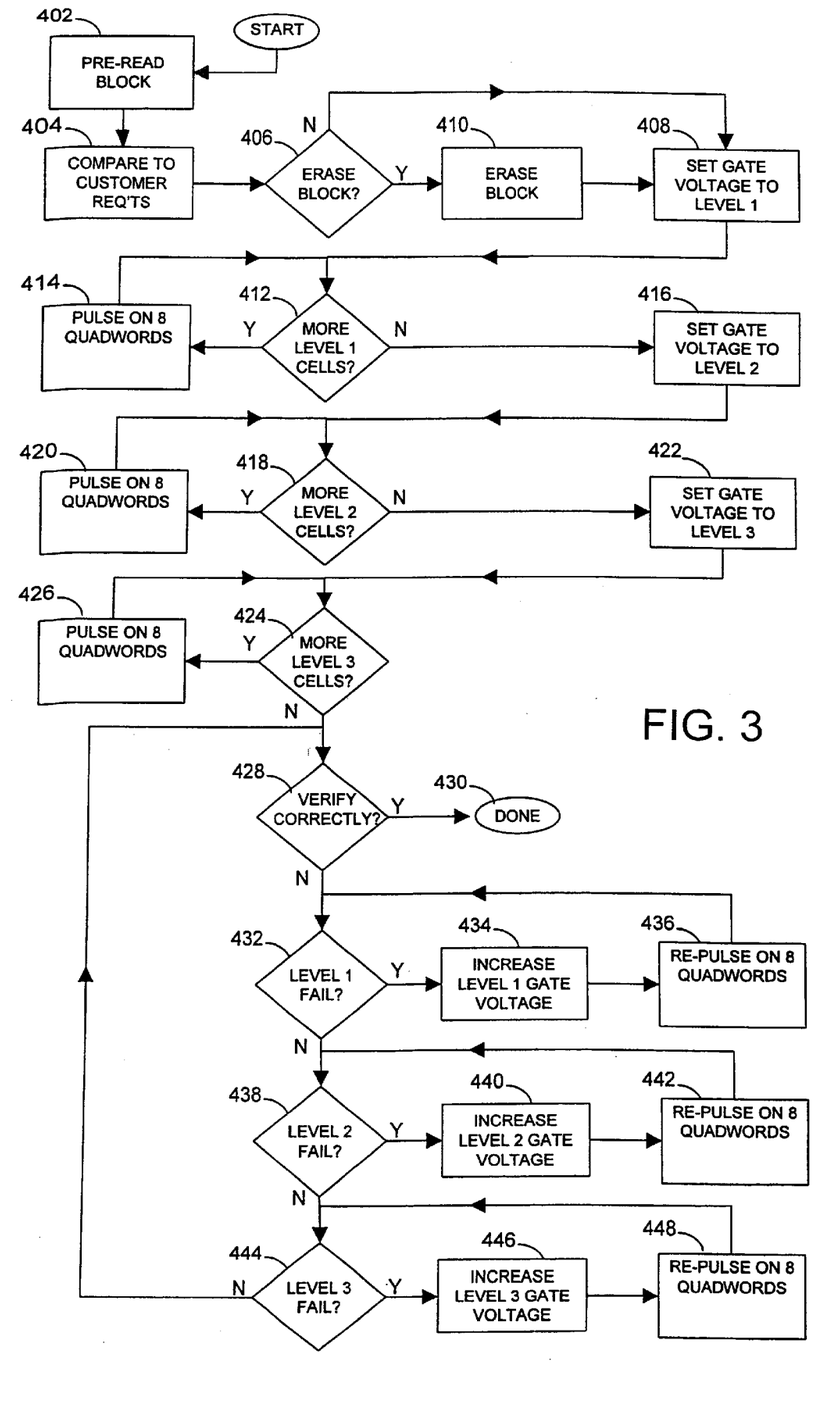
FIG. 3 illustrates a flowchart of a method of programming the memory device.

As illustrated in FIG. 3, during the operation of the memory device 120 described before in FIG. 1, a multi-level memory data is read 402. The data read is compared 404 to customer data requirements. The control engine microcoding sets 408 the gate voltage to a level corresponding with a voltage threshold level 1.

At 412, the control engine microcoding determines the location of multi-level memory cells in the data block that require programming to a voltage threshold level 1. Cells requiring level 1 programming are programmed 414.

In a particular implementation, the program pump may be sized to program an expected number of cells requiring level 1 programming in eight quadwords. Thus, up to eight quadwords may be programmed 414. The control engine microcoding loops back to 412 to determine the next number and location of up to eight quadwords of un-programmed cells requiring programming to voltage threshold level 1. This process of programming cells by progressively programming a smaller number of the cells until all cells are programmed is referred to as "nibbling."

"Nibbling" may be employed when the program pump lacks the bandwidth to program all the cells that require programming in the hunk. Cells are programmed up to the bandwidth of the pump. If more cells in the hunk requiring programming, another set of cells up to the bandwidth of the pump are programmed. Programming proceeds in until all cells in the hunk are programmed as required.

In a particular application of nibbling, the analysis of the subset of addresses of the data block may result in a determination that no cells in the subset require programming. If so, no pulsing is required on the subset of addresses and the control engine microcoding proceeds to select another subset of addresses from the data buffer.

When all cells requiring level 1 programming have been programmed, the control engine microcoding sets 416 the gate voltage to a level corresponding to voltage for threshold level 2.

At 418, the control engine microcoding determines the location of multi-level memory cells in the data block that require programming to voltage threshold level 2. Cells requiring level 2 programming are programmed 420. Assuming, the program pump 154 is sized to program an expected number of cells requiring level 2 programming in eight quadwords, up to eight quadwords are programmed 420. The control engine microcoding loops back to 418 to determine the next number and location of up to eight quadwords of un-programmed cells requiring programming to voltage threshold level 2. When all cells requiring level 2 programming have been programmed, the control engine microcoding sets 422 the gate voltage to a level corresponding to threshold level 3.

At 424, the control engine microcoding determines the location of multi-level memory cells in the data block that require programming to voltage threshold level 3. Cells requiring level 3 programming are programmed 426. Assuming again that the program pump 154 is sized to program an expected number of cells requiring level 3 programming in eight quadwords, up to eight quadwords are programmed 426, if required. The control engine microcoding loops back to 424 to determine the next number and location of up to eight quadwords of un-programmed cells requiring programming to voltage threshold level 3. The looping continues until all cells requiring programming to voltage level 3 have been programmed.

When all cells that require programming have been programmed, the control engine microcoding verifies 428 the efficacy of the programming. If the verification of the data in the multi-level cell block with the required customer requirements is satisfactory, programming is completed and the control engine microcoding exits at 430.

The cells are pulsed consecutively but verified together. Each segment of the algorithm (L1 pulsing, L2 pulsing, L3 pulsing, verify) requires different gate and drain voltages. To set up each voltage requires microseconds of slew time. Therefore, grouping the level pulsing and verify operations together can maximize usage of the time cost of slewing.

If the verification 428 fails, the control engine microcoding proceeds to 1) flag cells in the data buffer as programmed correctly, and 2) ascertain which level(s) failed verification. Cells in the multi-level memory block required to be at threshold voltage level 1 are ascertained 432. If there are cells programmed to voltage threshold level 1 that fail verify, the level 1 gate voltage is increased 434, and the failed cells are re-pulsed 436. In a particular implementation, the failed cells in eight quadwords are re-pulsed in groups up to the bandwidth of the program pump until all of the failed cells in the eight quadwords are re-pulsed. The control engine microcoding continues looping through blocks 432, 434 and 436 until all of the cells requiring a level 1 threshold voltage are re-pulsed.

Next, cells in the multi-level memory block required to be at threshold voltage level 2 are ascertained 438. If there are cells programmed to voltage threshold level 2 that fail verify, the level 2 gate voltage is increased 440, and the failed cells are re-pulsed 442. In a particular implementation, the failed cells in eight quadwords are re-pulsed in groups up to the bandwidth of the program pump until all of the failed cells in the eight quadwords are re-pulsed. The control engine microcoding continues looping through blocks 438, 440 and 442 until all of the cells requiring a level 2 threshold voltage are re-pulsed.

Next, cells in the multi-level memory block required to be at threshold voltage level 3 are ascertained 444. If there are cells programmed to voltage threshold level 3 that fail verify, the level 3 gate voltage is increased 446 and the failed multi-level memory cells are re-pulsed 448. In a particular implementation, the failed cells in eight quadwords are re-pulsed in groups up to the bandwidth of the program pump until all of the failed cells in the eight quadwords are re-pulsed. The control engine microcoding continues looping through blocks 444, 446 and 448 until all of the cells requiring a level 3 threshold voltage are re-pulsed.

The control engine microcoding then loops back to 428 where the multi-level memory block is again verified. The process of verifying, increasing the gate threshold voltage at each level, re-pulsing cells at each threshold level and verifying continues until the entire buffer is verified 428 and programming ends 430.

Figure 4A:
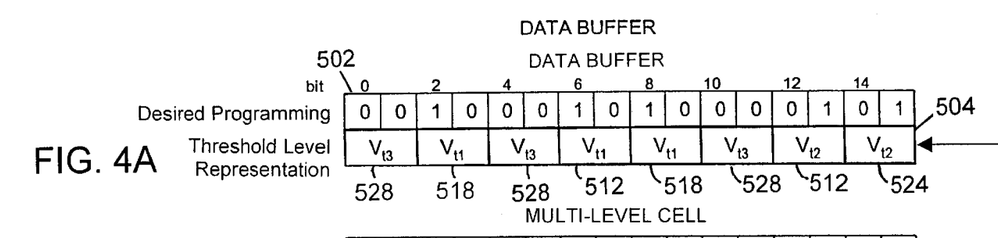
FIGS. 4A–4F illustrates an incremental result of the programming method of FIG. 3.

FIGS. 4A–4F illustrate an example of the incremental results of the programming algorithm of FIG. 3. A portion of customer desired programming data 502 is shown as a series of data bits (FIG. 4A). In the illustrated example, every two data bits can be represented by one of four voltage threshold levels. Threshold level representations 504 each correspond to two bits of the customer specified programming. In the example, threshold voltage level 3 ($V_{r3}$) corresponds to data bits "00". Similarly, threshold voltage level 2 ($V_{r2}$) corresponds to data bits "01"; threshold voltage level 1 ($V_{r1}$) to data bits "10"; and threshold voltage level 0 ($V_{r0}$) to data bits "11".

Figures 4B, 4C:
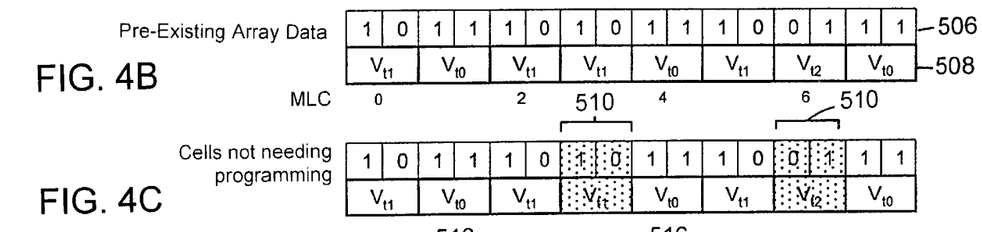

It is assumed that a multi-level memory array has a pre-existing data 506 (FIG. 4B). Each threshold level representation 508 corresponds to two bits of the pre-existing programming.

The pre-existing array data is compared to the desired programming. In the example illustrated, none of the bits are desired to be programmed from a "0" to a "1" and there is, therefore, no need to erase the multi-level cell block of data. As a result of the comparison, the control engine microcoding determines that two multi-level cell array locations 510 (FIG. 4C) do not require programming because their voltage thresholds match the levels 512 (FIG. 4A) desired by the customer. The cells not requiring further programming are shaded in FIG. 4C.

Figure 4D:
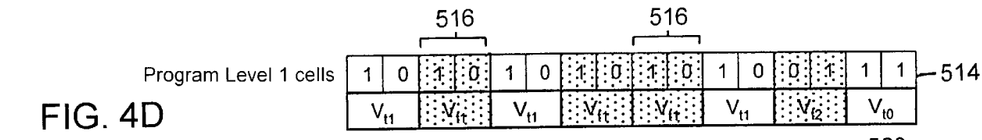

The control engine microcoding sets the gate voltage to the level 1 voltage ($V_{r1}$) corresponding with bit pattern "10." The control engine microcoding programs array data cells 516 (FIG. 4D) to the level 1 voltage to match the required customer cell programming 518 (FIG. 4A) resulting in array data 514 (FIG. 4D). The nibbling technique described above may be used to program the cells to level 1. It is possible that the number of cells requiring programming may exceed the capacity of the program pump to accomplish all at once. In such a case, the system programs up to the maximum number of cells that can be supported by the program pump 154. The control engine microcoding continues nibbling through the successive cells requiring programming until the programming of cells to level 1 is completed.

Figure 4E:
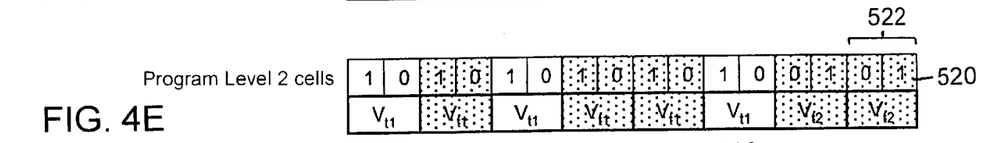

The control engine microcoding sets the gate voltage to the level 2 voltage ($V_{r2}$) corresponding to bit pattern "01." The control engine microcoding programs array data cells 522 (FIG. 4E) to level 2 voltage to match the required customer cell programming 524 (FIG. 4A) resulting in array data 520 (FIG. 4E). Successive nibbling may be necessary as described above. The system continues nibbling through the successive cells requiring programming until the programming of cells to level 2 is completed.

Figure 4F:
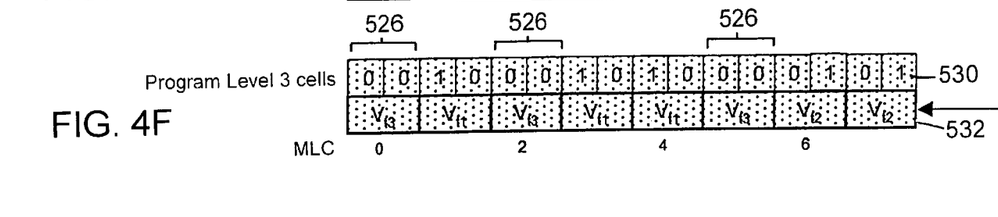

The control engine microcoding sets the gate voltage to the level 3 voltage ($V_{r3}$) corresponding to bit pattern "00." The system programs array data cells 526 (FIG. 4F) to level 3 voltage to match the required customer cell programming 528 (FIG. 4A) resulting in array data 530 (FIG. 4F). Successive nibbling may be necessary as described above. The system continues nibbling through the successive cells requiring programming until the programming of cells to level 3 is completed.

Subsequently, a comparison of programmed array data cells 532 (FIG. 4F) with customer required programming 504 (FIG. 4A) may be made to verify that the array is programmed correctly.

The system may verify that array data cells 530 and customer specified programming 504 both store the same data. As described in conjunction with FIG. 3, the system may re-pulse unverified cells at an increased gate voltage until all cells are verified.

Various features of the system can be embodied in the form of computer-implemented processes and apparatuses for practicing those processes. Some or all of the features of the system can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The various features can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

Other implementations are within the scope of the following claims.

What is claimed is:

1. A method comprising:
   identifying addresses in a data buffer for storing particular one of a plurality of threshold voltage levels, each of which is represented by a unique pattern of signals;
   pulsing array memory cells associated with the identified addresses to program the array memory cells to the particular threshold voltage level;
   repeating the identifying and pulsing for each of the threshold voltages levels; and
   subsequently verifying whether each array memory cell is programmed with a threshold voltage level that correctly represents the corresponding pattern of signals for that cell;
   wherein identifying addresses comprises:
     defining a subset of addresses in the data buffer;
     determining an expected number of cells in each state in the subset of addresses in the data buffer; and
   supplying sufficient current to pulse the expected number of cells.

2. The method of claim 1 wherein identifying addresses comprises:
   determining if cells in a first subset of addresses in the data buffer require programming; and
   if cells in the first subset of addresses do not require programming, then proceeding to evaluate whether cells in another subset of addresses in the data buffer require programming, without pulsing the first subset of addresses.

3. The method of claim 2 including skipping verifying of cells in subsets of addresses that do not require programming.

4. The method of claim 3 including skipping a pattern representing a lowest threshold voltage level.

5. A method comprising:
   identifying addresses in a data buffer for storing particular one of a plurality of threshold voltage levels, each of which is represented by a unique pattern of signals;
   pulsing array memory cells associated with the identified addresses to program the array memory cells to the particular threshold voltage level;
   repeating the identifying and pulsing for each of the threshold voltages levels; subsequently verifying whether each array memory cell is programmed with a threshold voltage level that correctly represents the corresponding pattern of signals for that cell;
   increasing the threshold voltage level;
   re-pulsing incorrectly programmed memory cells with the increased threshold voltage level;
   repeating the increasing and re-pulsing on incorrectly programmed memory cells at each threshold voltage level; and
   subsequently re-verifying whether each memory cell is programmed with a threshold voltage level that correctly represents the corresponding unique pattern of signals.

6. The method of claim 5 further comprising iteratively repeating said increasing, said re-pulsing, said repeating and said subsequently re-verifying until each memory cell is programmed with a threshold voltage level that correctly represents the corresponding pattern of signals for that cell.

7. The method of claim 6 wherein identifying addresses comprises:
   determining if cells in a first subset of addresses in the data buffer require programming; and if cells in the first subset of addresses do not require programming, then proceeding to evaluate whether cells in another subset of addresses in the data buffer require programming, without pulsing the first subset of addresses.

8. A method comprising:
   determining an expected number of array memory cells to be programmed to a plurality of threshold voltage levels, each of which is represented by a unique pattern of signals;
   sizing a program pump to supply sufficient current to program the expected number of cells;
   identifying addresses in a data buffer for storing a particular one of the plurality of threshold voltage levels;
   determining if cells in a first subset of addresses in the data buffer require programming; and
   if cells in the first subset of addresses do not require programming, then proceeding to evaluate whether cells in another subset of addresses in the data buffer require programming, without pulsing the first subset of addresses.

9. The method of claim 8 comprising:
   pulsing array memory cells associated with the identified addresses to program the array memory cells to the particular threshold voltage level;
   repeating the identifying and pulsing for each of the threshold voltage levels; and
   subsequently verifying whether each array memory cell is programmed with a threshold voltage level that correctly represents the corresponding pattern of signals for that cell.

10. The method of claim 7 further comprising:
    increasing the threshold voltage level;
    re-pulsing incorrectly programmed memory cells with the increased threshold voltage level;
    repeating the increasing and re-pulsing on incorrectly programmed memory cells at each threshold voltage level; and
    subsequently re-verifying whether each memory cell is programmed with a threshold voltage level that correctly represents the corresponding unique pattern of signals.

11. An article comprising a computer-readable medium storing computer-executable instructions for causing a computer system to:

identify addresses in a data buffer for storing a particular one of a plurality of threshold voltage levels, each of which is represented by a unique pattern of signals;

pulse array memory cells associated with the identified addresses to program the array memory cells to the particular threshold voltage level;

repeat the identifying and pulsing for each of the threshold voltage levels;

subsequently verify whether each array memory cell is programmed with a threshold voltage level that correctly represents the corresponding pattern of signals for that cell;

increase the threshold voltage level;

re-pulse incorrectly programmed memory cells with the increased threshold voltage level;

repeat the increasing and re-pulsing on incorrectly programmed memory cells at each threshold voltage level; and subsequently re-verify whether each memory cell is programmed with a threshold voltage level that correctly represents the corresponding unique pattern of signals.

12. An apparatus comprising:

a data buffer;

an array of memory cells;

a program pump coupled to the array of memory cells and a processor coupled to the data buffer, the array of memory cells, and the program pump, and configured to:

identify addresses in the data buffer for storing a particular one of a plurality of threshold voltage levels, each of which is represented by a unique pattern of signals;

cause the program pump to pulse array memory cells associated with the identified addresses to program the array memory cells to the particular threshold voltage level;

repeat the identifying and pulsing for each of the threshold voltage levels;

subsequently verify whether each array memory cell is programmed with a threshold voltage level that correctly represents the corresponding pattern of signals for that cell;

increase the threshold voltage level;

cause the program pump to re-pulse incorrectly programmed memory cells with the increased threshold voltage level;

cause the repeat of the increasing and re-pulsing on incorrectly programmed memory cells at each threshold voltage level; and subsequently re-verify whether each memory cell is programmed with a threshold voltage level that correctly represents the corresponding unique pattern of signals.

13. The apparatus of claim 12 wherein the processor is configured to:

determine if cells in a first subset of addresses in the data buffer require programming; and if cells in the first subset of addresses do not require programming, then proceed to evaluate whether cells in another subset of addresses in the data buffer require programming, without pulsing the first subset of addresses.

14. An apparatus comprising:

a data buffer;

an array of memory cells;

a program pump coupled to the array of memory cells; and a processor coupled to the data buffer, the array of memory cells, and the program pump, and configured to:

identify addresses in the data buffer for storing a particular one of a plurality of threshold voltage levels, each of which is represented by a unique pattern of signals;

determine if cells in a first subset of addresses in the data buffer require programming; and if cells in the first subset of addresses do not require programming, then proceed to evaluate whether cells in another subset of addresses in the data buffer require programming, without pulsing the first subset of addresses.

15. The apparatus of claim 14 wherein the processor is configured to:

interpret the signal pattern representing the threshold voltage level of the buffer memory cell; and compare the array memory cell signal pattern to the pattern stored at the associated address in the data buffer.

16. The apparatus of claim 15 wherein the processor is configured to:

cause the program pump to pulse array memory cells associated with the identified addresses to program the array memory cells to the particular threshold voltage level;

repeat the identifying, determining and pulsing for each of the threshold voltage levels; and subsequently verify whether each array memory cell is programmed with a threshold voltage level that correctly represents the corresponding pattern of signals for that cell.

17. The apparatus of claim 16 wherein the processor is configured to:

increase the threshold voltage level;

cause the program pump to re-pulse incorrectly programmed memory cells with the increased threshold voltage level;

cause the repeat of the increasing and re-pulsing on incorrectly programmed memory cells at each threshold voltage level; and subsequently re-verify whether each memory cell is programmed with a threshold voltage level that correctly represents the corresponding unique pattern of signals.

18. A method, comprising:

programming a first plurality of memory cells in a memory array that are identified to receive a first threshold voltage at gate terminals of the identified memory cells;

programming a second plurality of memory cells identified to receive the first threshold voltage; and programming a third plurality of memory cells identified to receive a second threshold voltage following the programming of the memory cells to the first threshold voltage.

19. The method of claim 18, further comprising verifying the programming of the first and second plurality of memory cells.

20. The method of claim 19, wherein verifying the programming of the first and second plurality of memory cells further comprises comparing information stored in the memory cells to desired program data.

21. The method of claim 19, further comprising re-programming the memory cells of the first and second plurality of memory cells that do not verify by using an increased first threshold voltage.

22. The method of claim 18, further comprising verifying the programming of the third plurality of memory cells.

23. The method of claim 22, further comprising re-programming the memory cells of the third plurality of memory cells that do not verify by using an increased second threshold voltage.

24. The method of claim 18, wherein programming the third plurality of memory cells further comprises using a gate voltage that differs from the gate voltage used in programming the first and second plurality of memory cells.

25. The method of claim 18, further comprising programming the first, second and third plurality of memory cells before a read operation to verify the programming of the memory cells.

26. A method comprising:
  determining if cells in a first subset of addresses in a data buffer require programming; and
  if cells in the first subset of addresses do not require programming, then proceeding to evaluate whether cells in another subset of addresses in the data buffer require programming, without pulsing the first subset of addresses.

* * * * *